(12) United States Patent
Maruno et al.

(10) Patent No.: US 11,656,374 B2
(45) Date of Patent: May 23, 2023

(54) PHOTON COUNTING DEVICE AND PHOTON COUNTING METHOD

(71) Applicant: HAMAMATSU PHOTONICS K.K., Hamamatsu (JP)

(72) Inventors: Tadashi Maruno, Hamamatsu (JP); Eiji Toda, Hamamatsu (JP); Mao Nakajima, Hamamatsu (JP); Teruo Takahashi, Hamamatsu (JP); Takafumi Higuchi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/502,424

(22) Filed: Oct. 15, 2021

(65) Prior Publication Data

US 2022/0035056 A1 Feb. 3, 2022

Related U.S. Application Data

(63) Continuation of application No. 16/764,066, filed as application No. PCT/JP2018/023144 on Jun. 18, 2018, now Pat. No. 11,204,432.

(30) Foreign Application Priority Data

Nov. 24, 2017 (JP) ................. 2017-225861

(51) Int. Cl.
*G01T 1/24* (2006.01)
*H04N 5/374* (2011.01)
(Continued)

(52) U.S. Cl.
CPC ............. *G01T 1/247* (2013.01); *H04N 5/363* (2013.01); *H04N 5/376* (2013.01); *H04N 5/378* (2013.01);
(Continued)

(58) Field of Classification Search
None
See application file for complete search history.

(56) References Cited

U.S. PATENT DOCUMENTS

2007/0045677 A1 3/2007 Lee et al.
2008/0265169 A1 10/2008 Spartiotis et al.
(Continued)

FOREIGN PATENT DOCUMENTS

CN 101485195 A 7/2009
CN 101980146 A 2/2011
(Continued)

OTHER PUBLICATIONS

English-language translation of International Preliminary Report on Patentability (IPRP) dated Jun. 4, 2020 that issued in WO Patent Application No. PCT/JP2018/023141.
(Continued)

*Primary Examiner* — Mark T Monk
(74) *Attorney, Agent, or Firm* — Faegre Drinker Biddle & Reath LLP

(57) ABSTRACT

A photon counting device includes a plurality of pixels each including a photoelectric conversion element configured to convert input light to charge, and an amplifier configured to amplify the charge converted by the photoelectric conversion element and convert the charge to a voltage, an A/D converter configured to convert the voltages output from the amplifiers of the plurality of pixels to digital values; and a conversion unit configured to convert the digital value output from the A/D converter to the number of photons by referring to reference data, for each of the plurality of pixels, and the reference data is created based on a gain and an offset value for each of the plurality of pixels.

20 Claims, 16 Drawing Sheets

(51) Int. Cl.
- H04N 5/3745 (2011.01)
- H01L 27/146 (2006.01)
- G01J 1/02 (2006.01)
- H04N 5/376 (2011.01)
- H04N 5/363 (2011.01)
- H04N 5/378 (2011.01)
- G01T 1/208 (2006.01)

(52) U.S. Cl.
CPC ....... *H04N 5/3742* (2013.01); *H04N 5/37455* (2013.01); *H04N 5/37457* (2013.01); *G01T 1/208* (2013.01)

(56) References Cited

U.S. PATENT DOCUMENTS

| | | | |
|---|---|---|---|
| 2008/0317200 | A1* | 12/2008 | Lecomte ............... G01T 1/2985 378/19 |
| 2011/0315854 | A1 | 12/2011 | Janesick |
| 2013/0114073 | A1 | 5/2013 | Namba et al. |
| 2014/0368704 | A1 | 12/2014 | Nishihara |
| 2015/0084802 | A1 | 3/2015 | Kimura et al. |
| 2015/0116567 | A1* | 4/2015 | Gossage ............... H04N 5/3653 348/311 |
| 2015/0319422 | A1 | 11/2015 | Fereyre et al. |
| 2016/0197116 | A1 | 7/2016 | Ikeda et al. |
| 2016/0234450 | A1 | 8/2016 | Nishihara et al. |
| 2017/0212253 | A1 | 7/2017 | Fu et al. |
| 2017/0261620 | A1 | 9/2017 | Kato et al. |
| 2018/0328783 | A1 | 11/2018 | Nishihara et al. |

FOREIGN PATENT DOCUMENTS

| | | | |
|---|---|---|---|
| CN | 104041010 | A | 9/2014 |
| CN | 104471441 | A | 3/2015 |
| CN | 104838645 | A | 8/2015 |
| CN | 105794115 | A | 7/2016 |
| CN | 107004281 | A | 8/2017 |
| EP | 2330625 | A2 | 6/2011 |
| JP | 2004-144734 | A | 5/2004 |
| JP | 2004-532998 | A | 10/2004 |
| JP | 2011-071958 | A | 4/2011 |
| JP | 2011-119441 | A | 6/2011 |
| JP | 2013-038661 | A | 2/2013 |
| JP | 2013-090139 | A | 5/2013 |
| JP | 2016-019115 | A | 2/2016 |
| JP | 2016-111670 | A | 6/2016 |
| JP | 2017-096720 | A | 6/2017 |
| JP | 2017-167125 | A | 9/2017 |
| JP | 2005-167918 | A | 6/2022 |
| WO | WO 03/001243 | A2 | 1/2003 |
| WO | WO 2016/006153 | A1 | 1/2016 |
| WO | WO 2016/076767 | A1 | 5/2016 |
| WO | WO 2016/080016 | A1 | 5/2016 |

OTHER PUBLICATIONS

International Preliminary Report on Patentability dated Jun. 4, 2020 for PCT/JP2018/023144.

Masoodian, Saleh et al., "A 1Mjot 1040fps 0.22e-rms Stacked BSI Quanta Image Sensor with Cluster-Parallel Readout," 2017 International Image Sensor Workshop (IISW), May 30-Jun. 2, 2017, p. 230-p. 233.

Jiaju Ma et al., "Photon-number-resolving megapixel image sensor at room temperature without avalanche gain", Optica, vol. 4, No. 12, Dec. 2017, p. 1474-p. 1481.

Dakota A. Starkey et al., "Determining Conversion Gain and Read Noise Using a Photon-Counting Histogram Method for Deep Sub-Electron Read Noise Image Sensors", Journal of the Electron Devices Society, vol. 4, No. 3, May 2016, p. 29-p. 35.

Office Action dated May 14, 2021 in U.S. Appl. No. 16/764,053.

Extended European Search Report dated Jun. 2, 2021 in European Patent Application No. 18881454.5.

Extended European Search Report dated Jun. 11, 2021 in European Patent Application No. 18881755.5.

* cited by examiner

PHOTON COUNTING DEVICE AND PHOTON COUNTING METHOD

CROSS-REFERENCE TO RELATED APPLICATIONS

This application is a continuation of U.S. patent application Ser. No. 16/764,066, filed May 14, 2020, which is 371 of International Patent Application No. PCT/JP2018/023144, filed Jun. 18, 2018, which claims the benefit of priority to Japanese Patent Application No. 2017-225861, filed Nov. 24, 2017, the contents of each of which is incorporated herein by reference.

TECHNICAL FIELD

The present disclosure relates to a photon counting device and a photon counting method.

BACKGROUND ART

For example, Non-Patent Literature 1 describes a photon counting technique using a CMOS image sensor. In this technique, imaging is performed under a condition that only one photon is incident on one pixel in one frame by increasing a frame rate of the image sensor.

CITATION LIST

Patent Literature

[Non-Patent Literature 1] B Saleh Masoodian, Jiaju Ma, Dakota Starkey, Yuichiro Yamashita, and Eric R. Fossum, "A 1 Mjot 1040 fps 0.22e-rms Stacked BSI Quanta Image Sensor with Cluster-Parallel Readout", Proceedings of 2017 International Image Sensor Workshop (IISW), May 30-Jun. 2, 2017, P230-233

SUMMARY OF INVENTION

Technical Problem

For example, when photon counting is performed using a CMOS image sensor, it is conceivable to discriminate the number of photons on the basis of a digital value output from an A/D converter. However, in the CMOS image sensor, each of pixels constituting the sensor has readout noise. Further, a gain and an offset value of a plurality of the pixels have a variation in a certain range. Therefore, there is concern that, for example, a digital value when one photon is incident and a digital value when two photons are incident may show the same value, and photon counting accuracy may be degraded.

An object of an aspect of the present disclosure is to provide a photon counting device and a photon counting method capable of curbing degradation of photon counting accuracy.

Solution to Problem

A photon counting device according to an aspect includes a plurality of pixels each including a photoelectric conversion element configured to convert input light to charge, and an amplifier configured to amplify the charge converted by the photoelectric conversion element and convert the charge to a voltage; an A/D converter configured to convert the voltages output from the amplifiers of the plurality of pixels to digital values; and a conversion unit configured to convert the digital value output from the A/D converter to the number of photons by referring to reference data, for each of the plurality of pixels, wherein the reference data is created on the basis of a gain and an offset value for each of the plurality of pixels.

In such a photon counting device, the voltage according to the photon input to the photoelectric conversion element is output from the amplifier. The output voltage is converted to a digital value by the A/D converter. The digital value is converted to the number of photons by the conversion unit. The conversion unit converts the digital value to the number of photons by referring to the reference data. The reference data is created on the basis of the respective gains and offset values in the plurality of pixels. Therefore, even when there is a variation in the gain and the offset value between the pixels, the conversion unit can convert the digital value to the number of photons while curbing an influence of the variation. Therefore, degradation of photon counting accuracy can be curbed.

Further, the reference data may include a plurality of pieces of threshold value data created on the basis of the gains and the offset values for the plurality of pixels, and the conversion unit may convert the digital value for each of the plurality of pixels to the number of photons on the basis of the plurality of pieces of threshold value data. With this configuration, even when there is variation in the gain and offset value for each pixel, the number of photons can be derived using a threshold value according to the variation.

Further, the reference data may include a parameter corresponding to the gain and the offset value, the parameter being a preset parameter common to the plurality of pixels, and the conversion unit may correct the digital value for each of the plurality of pixels on the basis of a deviation between the gain and the offset value, and the parameter, and convert the corrected digital value to the number of photons. In this configuration, since the digital value can be corrected according to a variation in the gain and the offset value, for example, the digital value can be converted to the number of photons using the same threshold value in all the pixels.

Further, the readout noise of the amplifier may be equal to or less than 0.2 [e-rms]. In this case, for example, an incorrect detection rate can be curbed to 1% or less. Further, the readout noise of the amplifier may be equal to or less than 0.15 [e-rms]. In this case, for example, the incorrect detection rate can be curbed to 0.1% or less.

Further, the gain may be equal to or more than 10 [DN/e]. By increasing the gain, it is possible to accurately reproduce an analog value that is output from the amplifier.

Further, a photon counting method of an aspect includes converting light input to respective photoelectric conversion elements constituting a plurality of pixels to charge; amplifying, by an amplifier constituting the plurality of pixels, the converted charge and converting the charge to a voltage; converting, by an A/D converter, the voltages output from the respective amplifiers to digital values and outputting the digital values; and converting the digital value of each of the plurality of pixels output from the A/D converter to the number of photons on the basis of respective gain and offset values of the plurality of pixels.

In such a photon counting method, the voltage output from the amplifier is converted to a digital value by the A/D converter according to input photons. The digital value is converted to the number of photons on the basis of the respective gain and offset values of the plurality of pixels. Therefore, even when there is a variation in the gain and the offset value between the pixels, the digital value can be converted to the number of photons while curbing an influence of the variation. Therefore, degradation of photon counting accuracy can be curbed.

Further, the converting of the digital value to the number of photons includes converting the digital value to the number of photons using threshold value data created for each of the plurality of pixels on the basis of the respective gains and offset values in the plurality of pixels. With this configuration, even when there is variation in the gain and offset value for each pixel, the number of photons can be derived using a threshold value according to the variation.

Further, the converting of the digital value to the number of photons includes correcting the digital value of each of the plurality of pixels on the basis of a deviation between the gain and the offset value, and a parameter, and converting the corrected digital value to the number of photons, and the parameter corresponds to the gain and the offset value, and is set in advance to be common to the plurality of pixels. In this configuration, since the digital value can be corrected according to a variation in the gain and the offset value, for example, the digital value can be converted to the number of photons using the same threshold value in all the pixels.

Advantageous Effects of Invention

With the photon counting device and the photon counting method according to an aspect, it is possible to curb degradation of photon counting accuracy.

DESCRIPTION OF EMBODIMENTS

Figure 1:
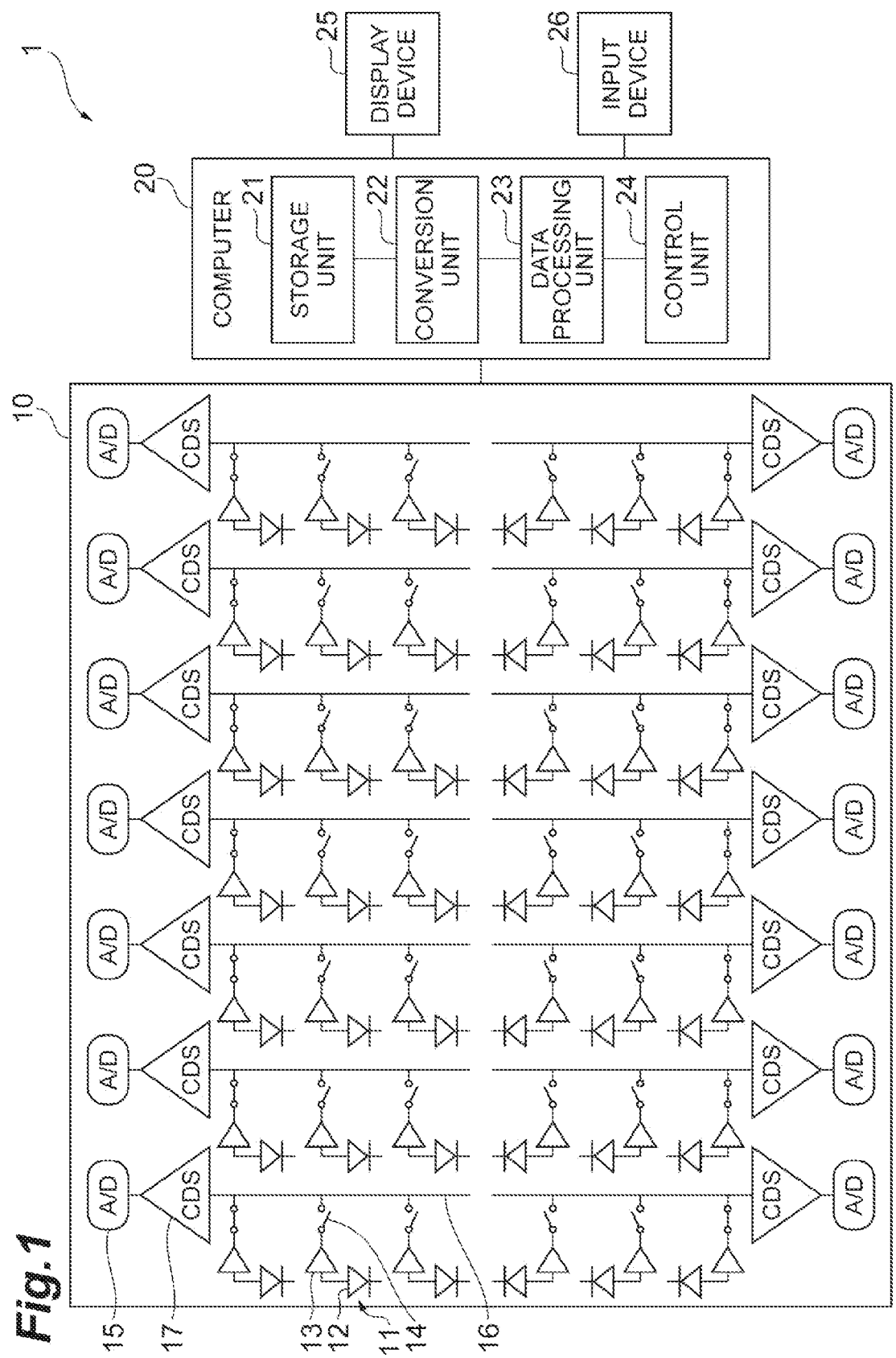
FIG. 1 is a diagram illustrating a configuration of a photon counting device according to an embodiment.

Hereinafter, embodiments will be specifically described with reference to the drawings. For convenience, substantially the same elements are denoted by the same reference numerals, and a description thereof may be omitted. Further, photon counting in the embodiments includes both counting of the number of photoelectrons generated in each pixel of an image sensor and counting of the number of photons in consideration of a quantum efficiency (QE) of an image sensor.

First Embodiment

FIG. 1 is a diagram illustrating a configuration of a photon counting device. As illustrated in FIG. 1, the photon counting device 1 includes a CMOS image sensor 10, and a computer 20 connected to the CMOS image sensor 10. The CMOS image sensor 10 includes a plurality of pixels 11 and A/D converters 15. The plurality of pixels 11 are disposed two-dimensionally and arranged in a row direction and a column direction. Each pixel 11 has a photodiode (a photoelectric conversion element) 12 and an amplifier 13. The photodiode 12 accumulates electrons (photoelectrons) generated due to input of photons as charge. The amplifier 13 converts the charge accumulated in the photodiode 12 to a voltage and amplifies the voltage. The amplified voltage is transferred to a vertical signal line 16 for each line (for each row) by switching of a selection switch 14 of each pixel 11. A correlated double sampling (CDS) circuit 17 is disposed in each vertical signal line 16. The CDS circuit 17 removes noise that varies between pixels, and temporarily stores the transferred voltage.

The A/D converter 15 converts the voltage output from each of the amplifiers 13 in the plurality of pixels 11 to a digital value. In the first embodiment, the A/D converter 15 converts the voltage stored in the CDS circuit 17 to a digital value. The respective digital values after the conversion are output to the computer 20. For example, the digital value may be sent to a horizontal signal line (not illustrated) by switching for column selection and output to the computer 20. Thus, in the CMOS image sensor 10, when photons are input to each pixel 11, a digital value according to the number of input photons is output to the computer 20. The A/D converter 15 may be provided in each pixel 11.

Figure 2:
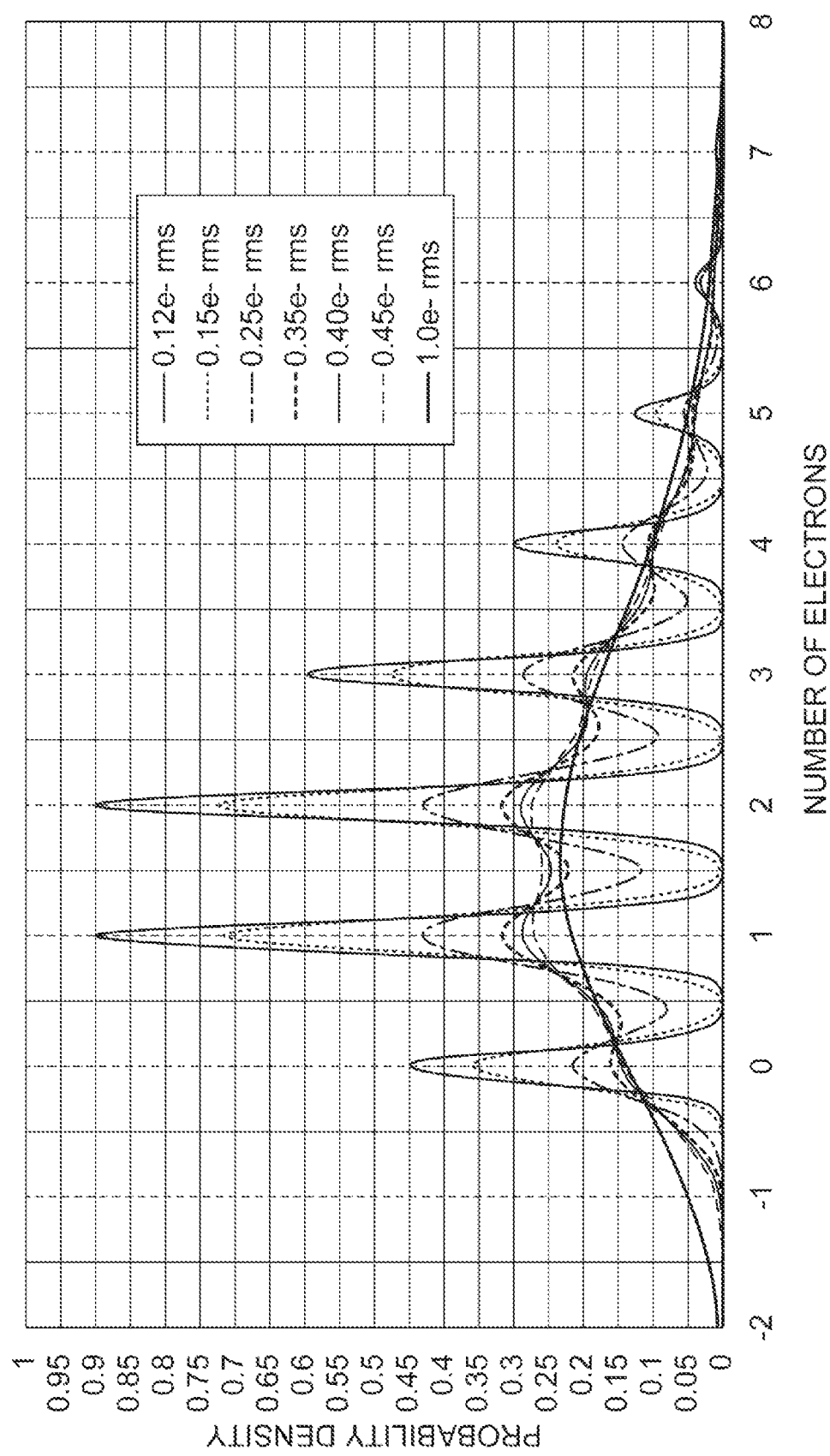
FIG. 2 is a graph showing a relationship between the number of electrons and a probability density.

When the voltage amplified by the amplifier 13 is read, readout noise, which is random noise, is generated in the amplifier 13. FIG. 2 is a graph showing a probability distribution of electrons, in which a horizontal axis represents the number of electrons and a vertical axis represents a probability density. The number of electrons generated by the input photons follows a Poisson distribution, as illustrated in FIG. 2. In FIG. 2, the probability distribution of electrons when two photons are input to one pixel on average is shown for each readout noise.

Examples of the readout noise include 0.12, 0.15, 0.25, 0.35, 0.40, 0.45, and 1.0 [e-rms]. When the readout noise is smaller, a peak of a waveform of the probability distribution appears to be sharper and separation of distributions for respective numbers of electrons becomes clear, as illustrated in FIG. 2. On the other hand, when the readout noise increases, distributions overlap with each other in the adjacent numbers of electrons, and it becomes difficult to separate the distributions of the respective numbers of electrons. For example, when the readout noise is equal to or less than 0.40 [e-rms], a peak for each number of electrons appears to be identifiable. On the other hand, when the readout noise is equal to or more than 0.45 [e-rms], it is difficult to identify the peak for each number of electrons. In the first embodiment, a magnitude of the readout noise allowing distinguishment between the numbers of electrons to be distinguished has been obtained according to whether or not the peak can be identified. Thereby, in the CMOS image sensor 10 of the first embodiment, the readout noise is equal to or less than 0.4 [e-rms]. An inflection point may be detected by secondarily differentiating the probability distribution and the magnitude of the readout noise allowing distinguishment between the numbers of electrons may be obtained.

Figure 3:
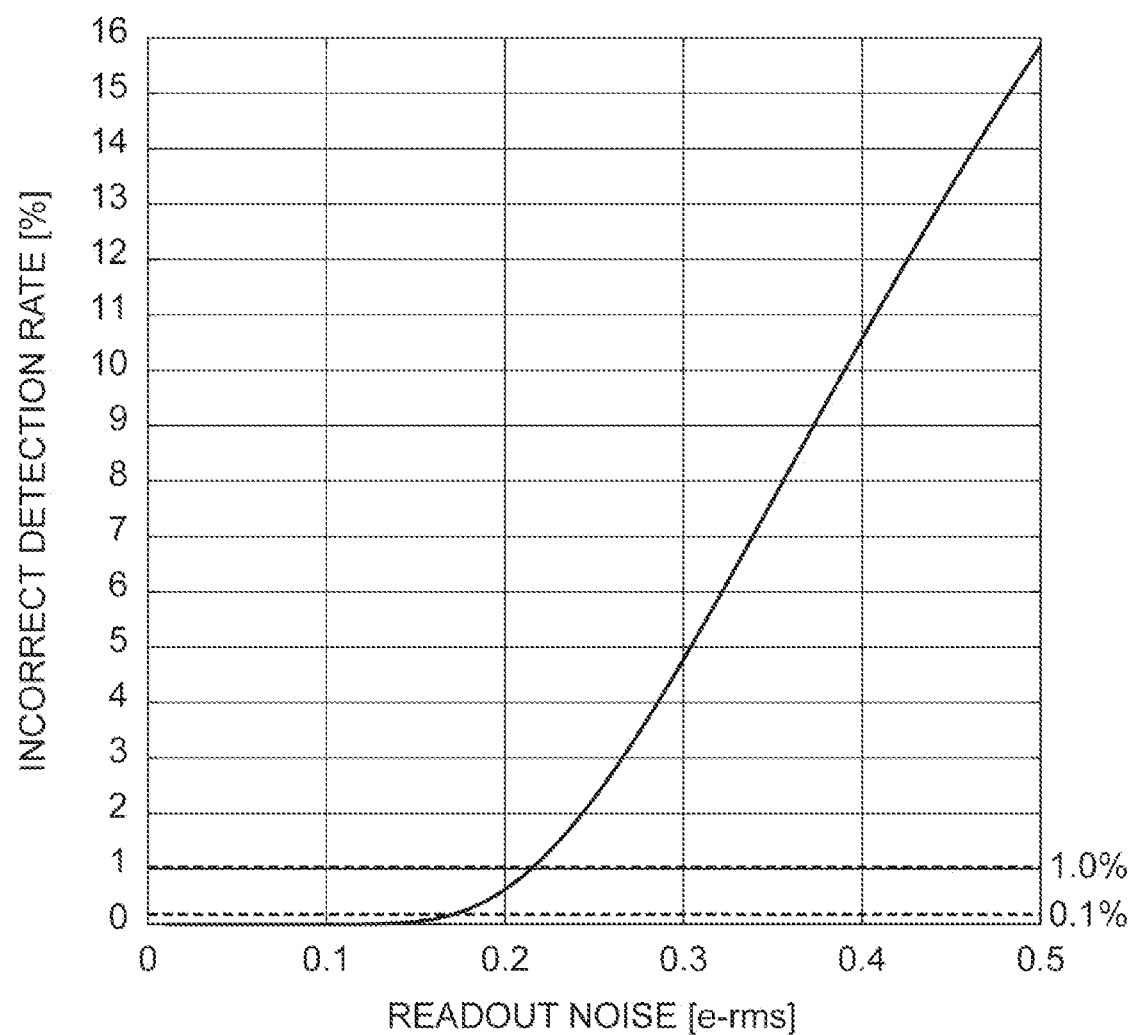
FIG. 3 is a graph showing a relationship between readout noise and an incorrect detection rate.

When a threshold value for distinguishing between the adjacent numbers of electrons has been set, an incorrect detection rate of the number of detected electrons changes according to readout noise. FIG. 3 is a graph showing a relationship between the readout noise and the incorrect detection rate when a threshold value is an intermediate value between the numbers of electrons, such as 0.5e, 1.5e, 2.5e, . . . . The incorrect detection rate is a rate at which an incorrect number of electrons is detected, and is caused by the spread of the probability distribution of the electrons. As illustrated in FIG. 3, when the incorrect detection rate is desired to be equal to or less than 1%, the readout noise needs to be equal to or less than 0.2 [e-rms]. Further, when the incorrect detection rate is desired to equal to or less than 0.1%, the readout noise needs to be equal to or less than 0.15 [e-rms].

Figure 4B:
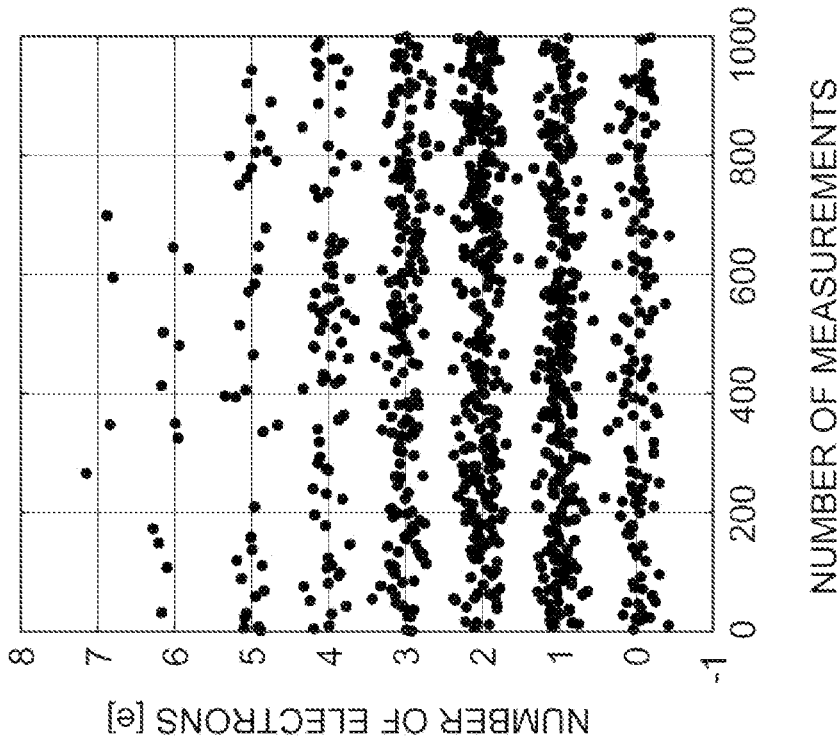
FIG. 4B is a graph showing a result of a simulation based on FIG. 4A.
Figure 4A:
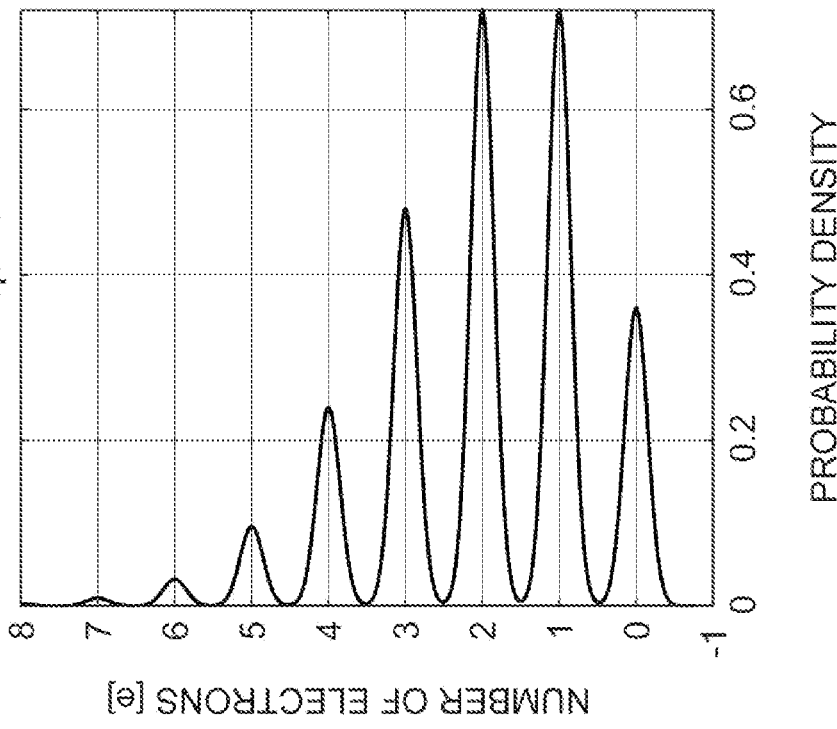
FIG. 4A is a graph showing a relationship between the number of electrons and a probability density.

FIG. 4A is a graph showing a relationship between the number of electrons and the probability density. FIG. 4B is a graph showing a result of a simulation based on FIG. 4A. In FIG. 4A, a probability distribution of electrons when two photons are input to one pixel on average in a case in which readout noise is 0.15 [e-rms] is shown. In FIG. 4B, a distribution of the number of electrons for each number of measurements is shown by an analog value. The A/D converter 15 converts the analog value illustrated in FIG. 4B to a digital value and outputs the digital value. The digital value output from each pixel 11 is shown by the following equation.

Digital value [DN]=gain [DN/e]×number of electrons [e]+offset value [DN]

Figure 5B:
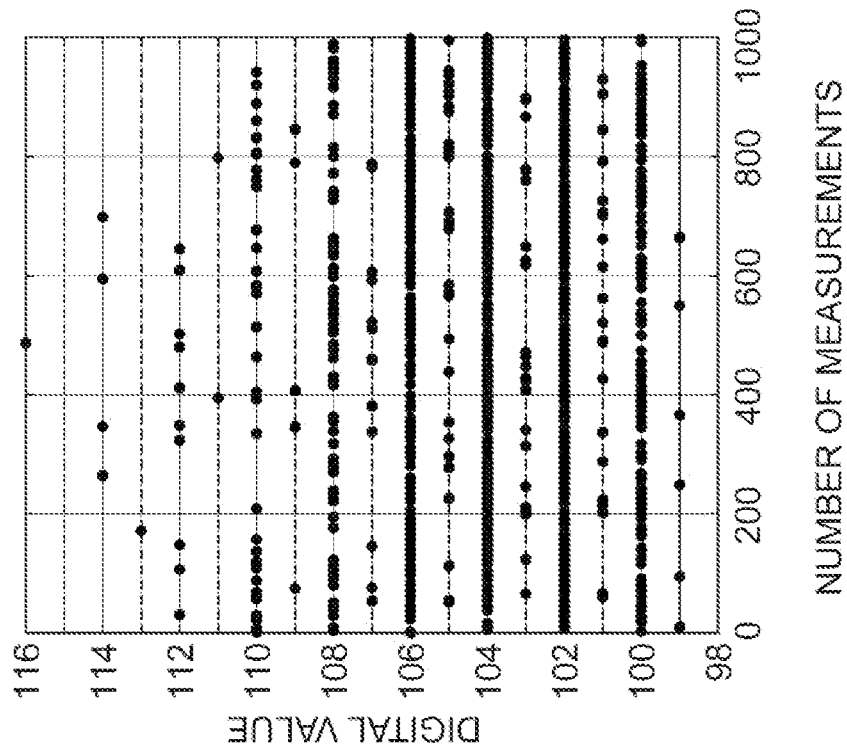
FIG. 5B is a graph in which a result of a simulation based on FIG. 5A has been converted to a digital value.
Figure 5A:
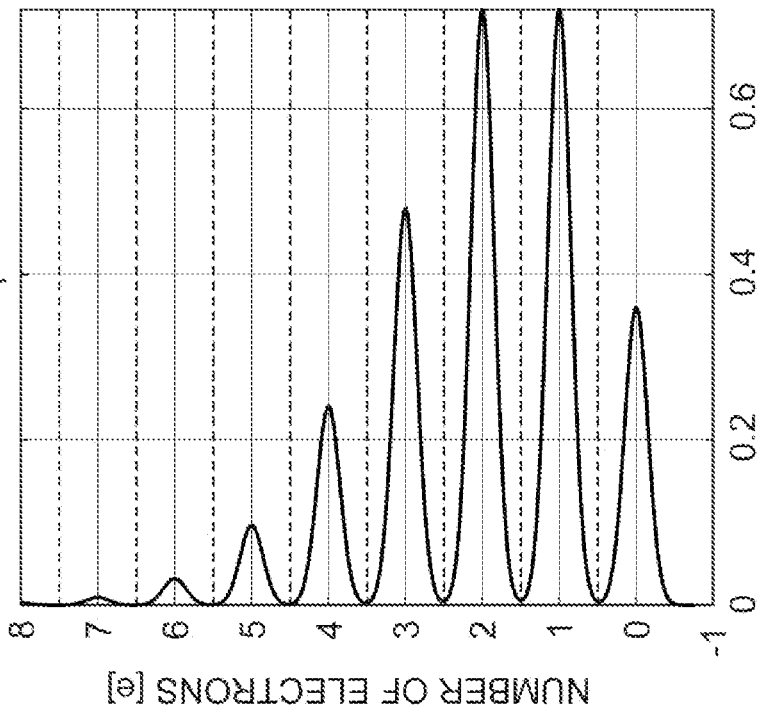
FIG. 5A is a graph showing a relationship between the number of electrons and a probability density.
Figure 6A:
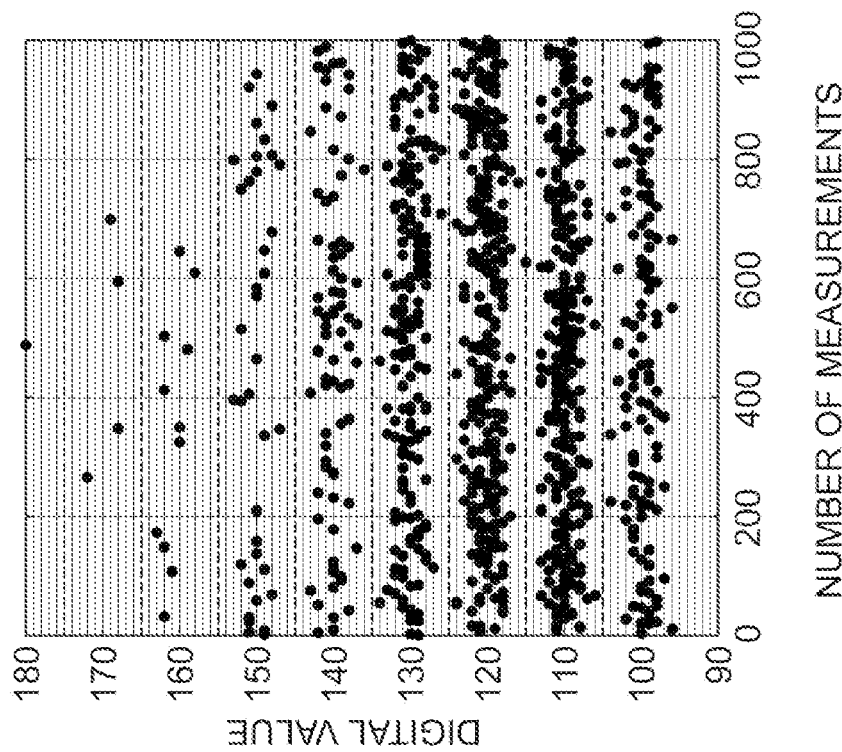
FIG. 6A is a graph showing a relationship between the number of electrons and a probability density.
Figure 6B:
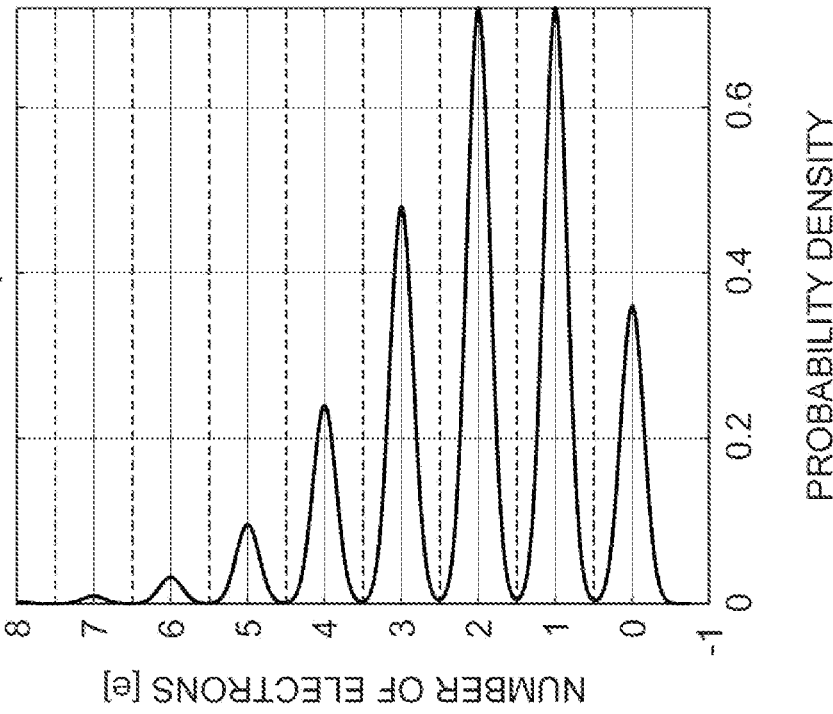
FIG. 6B is a graph in which a result of a simulation based on FIG. 6A has been converted to a digital value.
Figure 7A:
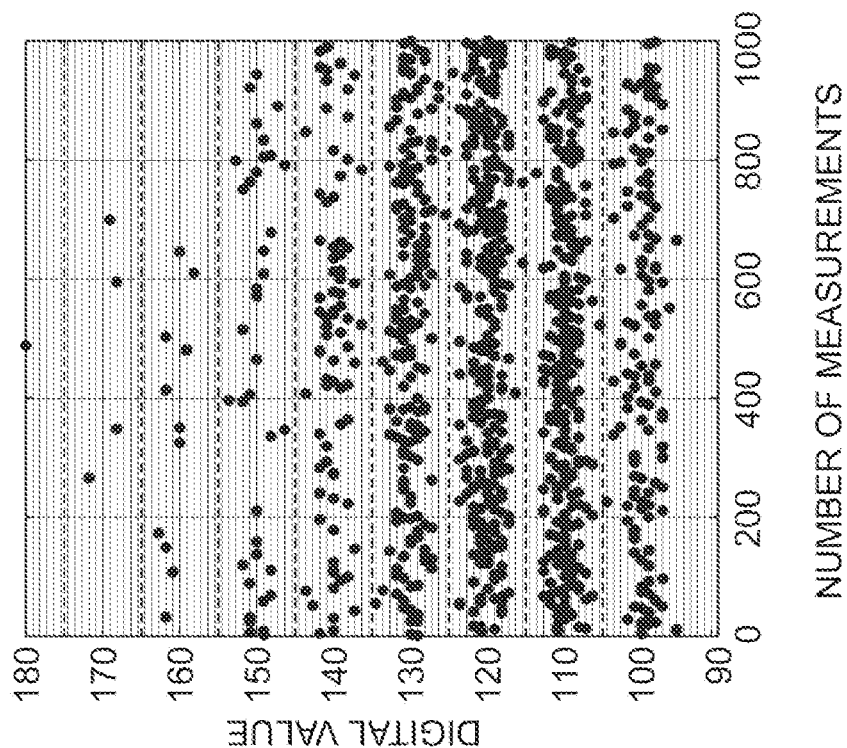
FIG. 7A is a graph showing a relationship between the number of electrons and a probability density.
Figure 7B:
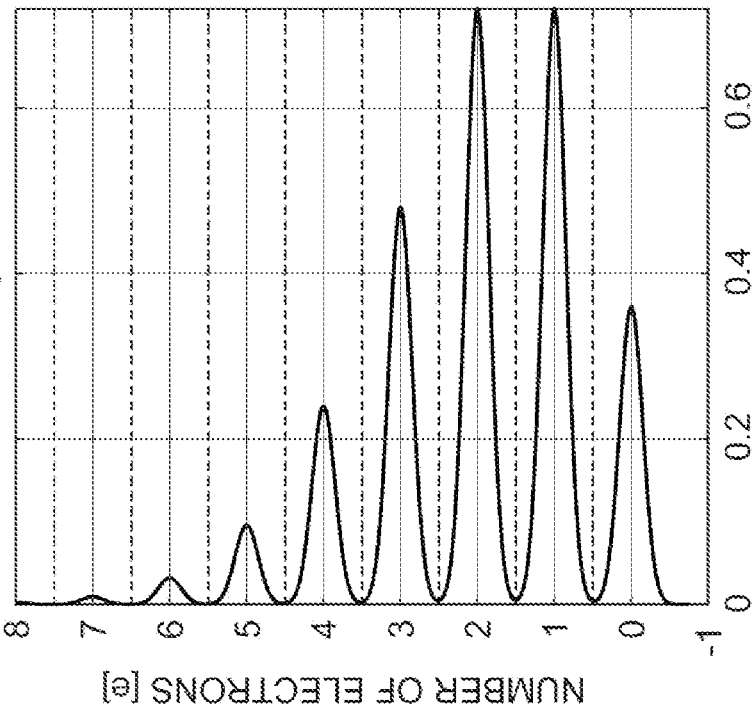
FIG. 7B is a graph in which a result of a simulation based on FIG. 7A has been converted to a digital value.

FIGS. 5B, 6B, and 7B show graphs when the analog value of FIG. 4B has been converted to a digital value. In FIGS. 5A, 6A, and 7A, a probability distribution of electrons when two photons are input to one pixel on average in a case in which readout noise is 0.15 [e-rms] is shown, as in FIG. 4A. In FIGS. 5 to 7, threshold values for distinguishing the numbers of electrons are set with reference to intermediate values between the numbers of electrons, such as 0.5e, 1.5e, 2.5e . . . . In FIGS. 5 to 7, the threshold values are indicated by broken lines. In FIG. 5B, the gain is 2 [DN/e] and the offset value is 100 [DN]. As illustrated in FIG. 5B, when the gain is 2 [DN/e], it is difficult for a variation in a measured value observed in an analog value to be reflected on the graph. Further, a proportion of output of digital values showing the same value as the threshold value is high.

In FIG. 6B, the gain is 10 [DN/e] and the offset value is 100 [DN]. As illustrated in FIG. 6B, when the gain is 10 [DN/e], a distribution of digital values approximates to a distribution of analog values. On the other hand, since the gain is an even number, a digital value corresponding to the threshold value may be taken as illustrated in FIG. 6B. In FIG. 7B, the gain is 11 [DN/e] and the offset value is 100 [DN]. As illustrated in FIG. 7B, when the gain is 11 [DN/e], the distribution of the digital values approximates to the analog values.

Further, since the gain is an odd number, taking a digital value corresponding to the threshold value is curbed. Thus, by increasing a value of the gain, the output digital value can further approximate to the analog value. In the first embodiment, the CMOS image sensor 10 may have, for example, a gain equal to or more than 10 [DN/e].

Refer back to FIG. 1. The computer 20 physically includes, for example, a storage device such as a RAM and a ROM, a processor (an arithmetic circuit) such as a CPU, and a communication interface. Examples of such a computer 20 include a personal computer, a cloud server, a smart device (a smartphone, a tablet terminal, or the like), a microcomputer, and a field-programmable gate array (FPGA). The computer 20 functions as a storage unit 21, a conversion unit 22, a data processing unit 23, and a control unit 24 by a CPU of a computer system executing a program stored in a storage device. The computer 20 may be disposed inside a camera including the CMOS image sensor 10, or may be disposed outside the camera. A display device 25 and an input device 26 can be connected to the computer 20. The display device 25 is a display that can display, for example, a photon counting result obtained by the computer 20. The input device 26 is a keyboard, a mouse, and the like allowing a user to input measurement conditions. A common touch screen may be used as the display device 25 and the input device 26.

The storage unit 21 stores a table (reference data) for converting the digital value output from the CMOS image sensor 10 to the number of photons. The table is, for example, a look-up table. The table is created on the basis of the respective gain and offset values of the plurality of pixels 11. In the first embodiment, threshold value data associated with each of the pixels 11 is stored as a table.

The conversion unit 22 converts the digital value of each of the plurality of pixels 11 output from the A/D converter 15 to the number of photons by referring to the table stored in the storage unit 21. The data processing unit 23 creates a two-dimensional image indicating the number of photons in each pixel 11 on the basis of the number of photons output from the conversion unit 22. Further, the data processing unit 23 may create, for example, a histogram, which is a plot of the number of pixels with respect to the number of photons. The created two-dimensional image or the like can be output to the display device 25. The control unit 24 can generally control each function of the computer 20 or the CMOS image sensor 10.

Next, details of the photon counting device 1 will be described focusing on a process of the conversion unit 22. Hereinafter, for the sake of simplicity of a description, a description will be given assuming that the CMOS image sensor 10 of the photon counting device includes the pixels 11 arranged in 3 rows×3 columns.

Figure 8:
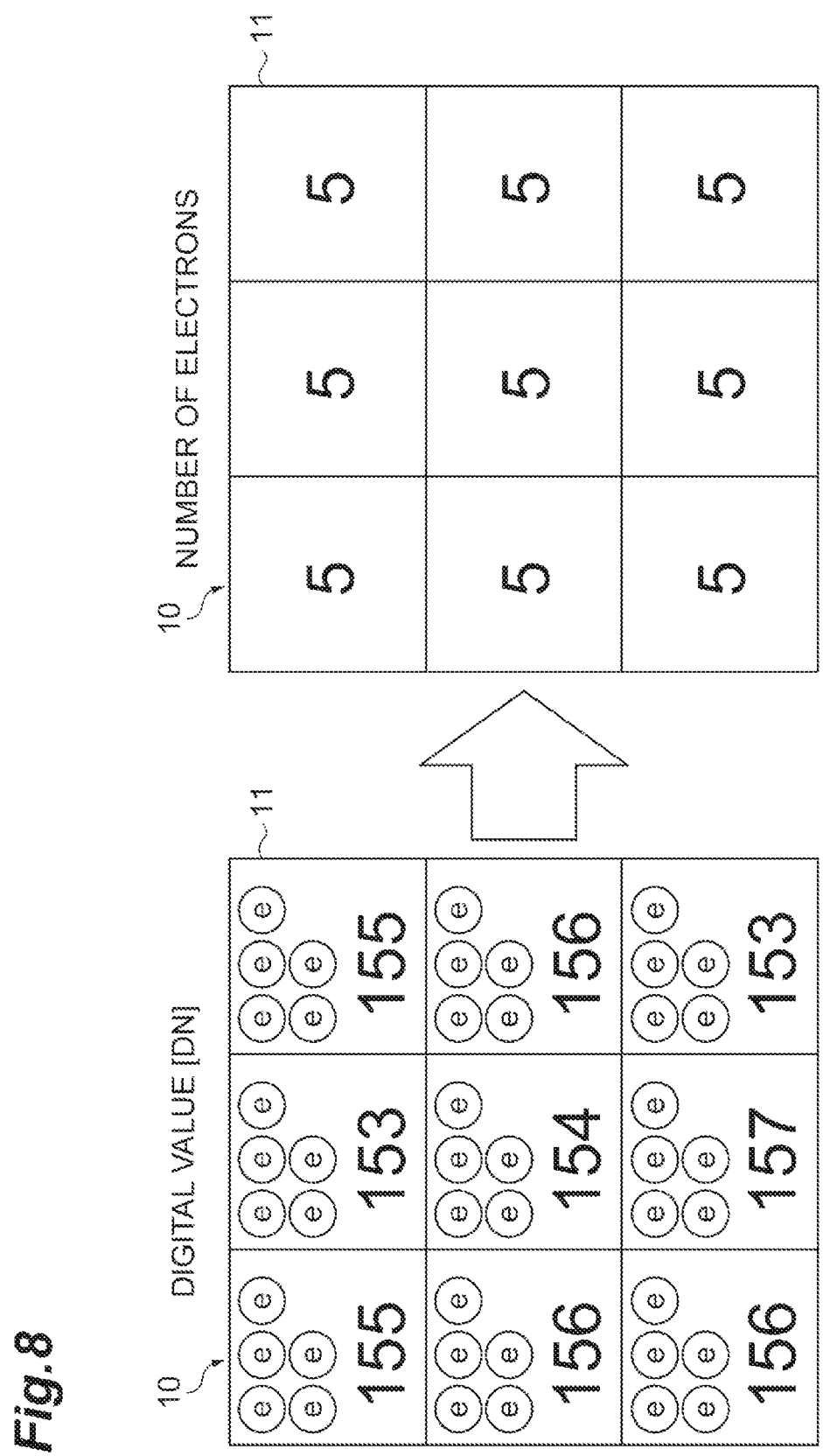
FIG. 8 is a diagram schematically illustrating a process of converting a measured digital value to a number of photons.

First, a method of converting a digital value to a number of photons when it is assumed that there is no variation in gain and offset values will be described. FIG. 8 schematically illustrates a process of converting the measured digital value to the number of electrons. In the example of FIG. 8, it is assumed that the offset value is 100 [DN] and the gain is 11 [DN/e] in each pixel. Further, the readout noise is assumed to be 0.15 [e-rms].

As illustrated in FIG. 8, in such a CMOS image sensor 10, when photons are input to each pixel 11, charge is accumulated in each pixel 11 according to the number of photons. In the illustrated example, five electrons are accumulated in all the pixels 11. The accumulated charge is converted to a voltage by the amplifier 13 and is converted to a digital value by the A/D converter 15. In FIG. 8, the digital value in each pixel is shown inside the pixel. The converted digital value is converted to the number of electrons. In this case, the digital value is converted to the number of electrons using, for example, a threshold value range. In the example of FIG. 8, it is assumed that there is no variation in the gain and the offset value as described above. Therefore, when an upper limit and a lower limit of the threshold value range are intermediate values of the number of electrons, a threshold value range corresponding to five electrons is equal to or more than 4.5e and less than 5.5e. This threshold value range is 150 to 160 [DN] in a digital value. When the digital value illustrated in FIG. 8 has been converted to the number of electrons by referring to this threshold value range, the digital value is converted to five electrons in any pixel 11. Since the number of electrons generated by the input photons follows the Poisson distribution as described above, it is possible to obtain the average number of photons by dividing the average number of electrons for each pixel by the quantum efficiency. When the quantum efficiency is 100%, the number of electrons is the same as the number of photons.

Figure 9:
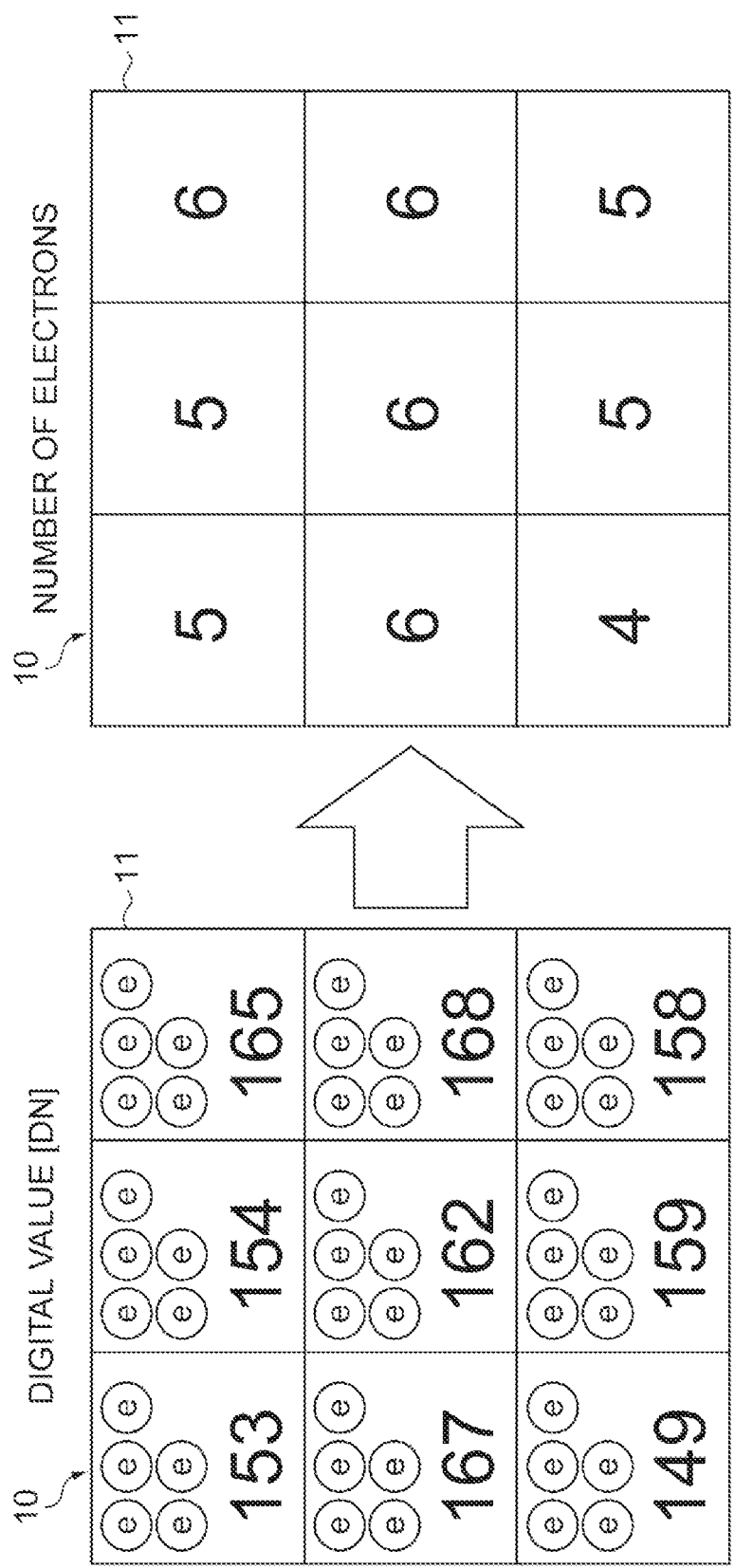
FIG. 9 is a diagram schematically illustrating a process of converting a measured digital value to a number of photons.

Next, a case in which a digital value is converted to the number of electrons using the same threshold value range in a state in which the gain and the offset value have a variation will be considered. FIG. 9 illustrates digital values when the gain and the offset value have a variation. In this example, an average gain is 11 [DN/e], and a variation σ in the gain is 10%. That is, a gain ±σ can have a value of 9.9 to 12.1. Further, an average offset value is 100 [DN], and a variation σ in the offset value is 3%. That is, an offset value ±σ can have a value from 97 to 103. In the example in FIG. 9, a model in which five electrons are accumulated in all the pixels, as in FIG. 8, is shown. When the same threshold value as in the example of FIG. 8 is used, four electrons are accumulated in the case of 139 to 149, five electrons are accumulated in the case of 150 to 160, and six electrons are accumulated in the case of 161 to 171. Thus, it may be difficult to convert the digital value to a correct number of electrons in a state in which the gain and the offset value have a variation.

Figure 10:
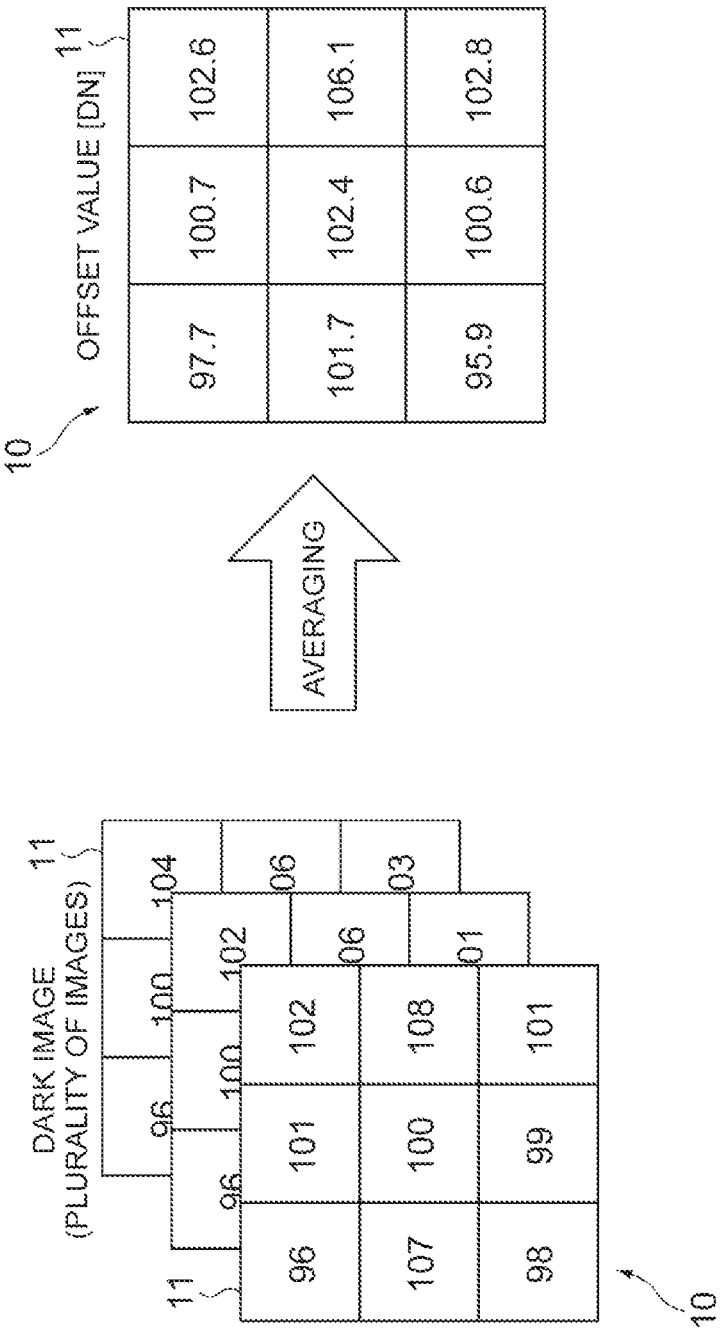
FIG. 10 is a diagram schematically illustrating a process of deriving an offset value.

Therefore, the conversion unit 22 of the first embodiment converts the digital value for each of the plurality of pixels output from the A/D converter 15 to the number of electrons by referring to the table stored in the storage unit 21. The table has the threshold value data created on the basis of the respective offset values and gains in the plurality of pixels 11. FIG. 10 is a schematic diagram illustrating a process of acquiring an offset value. The digital value is expressed by the following equation as described above. Therefore, the offset value is indicated as a digital value output in a state in which no light is input. Therefore, in the first embodiment, a plurality of digital values are acquired from a plurality of dark images acquired by the CMOS image sensor 10 in a state in which light is not input, as illustrated in FIG. 10. The offset value is acquired by averaging the acquired digital values for each pixel.

Digital value [DN]=gain [DN/e]×number of electrons [e]+offset value [DN]

Figure 11:
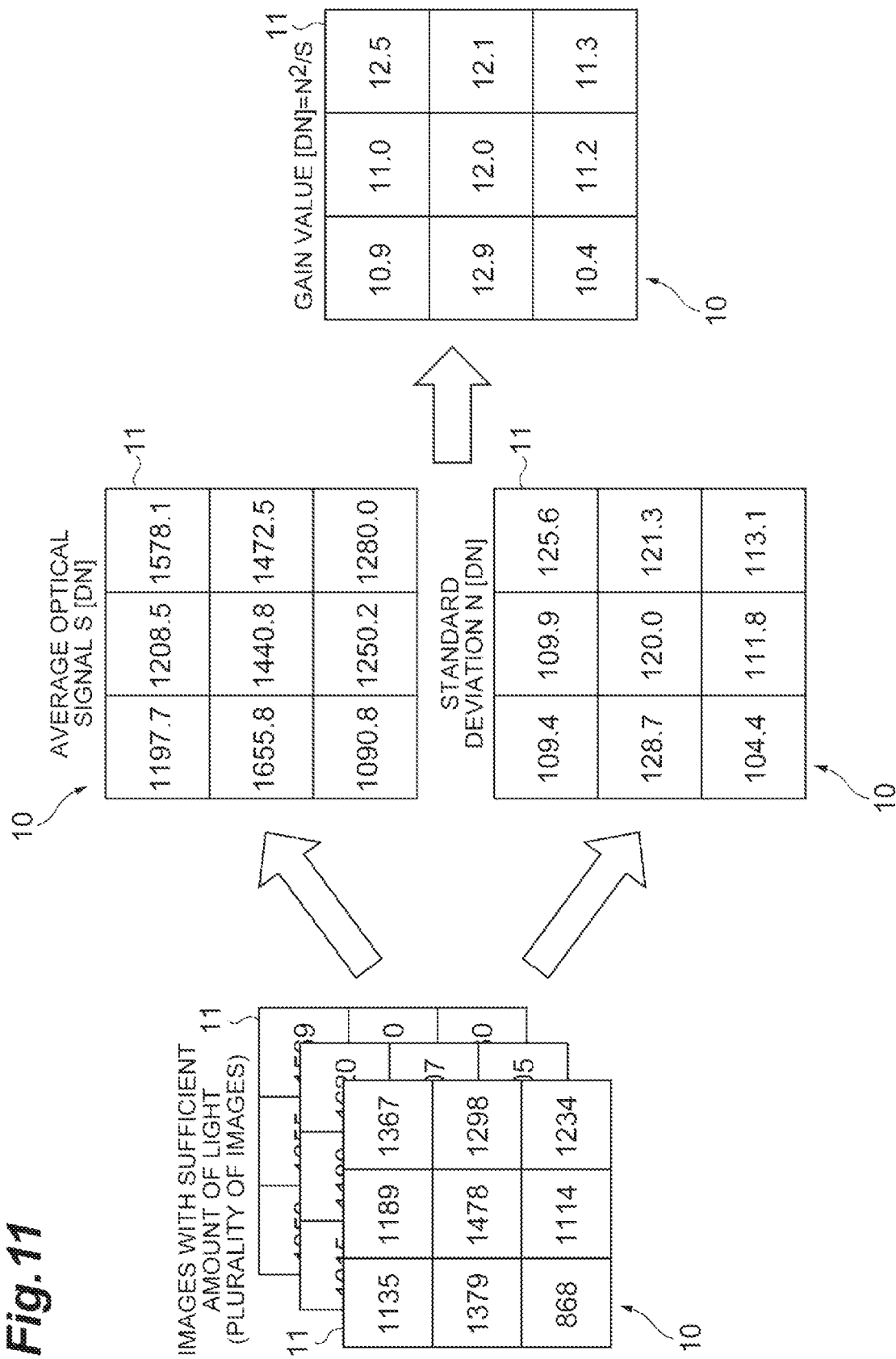
FIG. 11 is a diagram schematically illustrating a process of deriving a gain.

FIG. 11 is a schematic diagram illustrating a process of acquiring a gain. When a gain of each pixel is acquired, a plurality of frame images are acquired by the CMOS image sensor 10 with a sufficient amount of light. An average optical signal value S [DN] of the digital value in each pixel and a standard deviation N [DN] are acquired. Since the gain is expressed by $N^2/S$, the gain is derived from the average optical signal value S and the standard deviation N.

The storage unit 21 of the first embodiment holds, as a table, the threshold value data for each pixel derived on the basis of the gain and the offset value. When the threshold value is an intermediate value of the number of electrons, a threshold value indicating a lower limit of each number of electrons and a threshold value indicating an upper limit thereof are respectively expressed by the following equations, and a range of the lower limit threshold value and the upper limit threshold value is a threshold range corresponding to the number of electrons.

Threshold value (lower limit)=(number of electrons−0.5)×gain+offset value

Threshold value (upper limit)=(number of electrons+0.5)×gain+offset value

Figure 12:
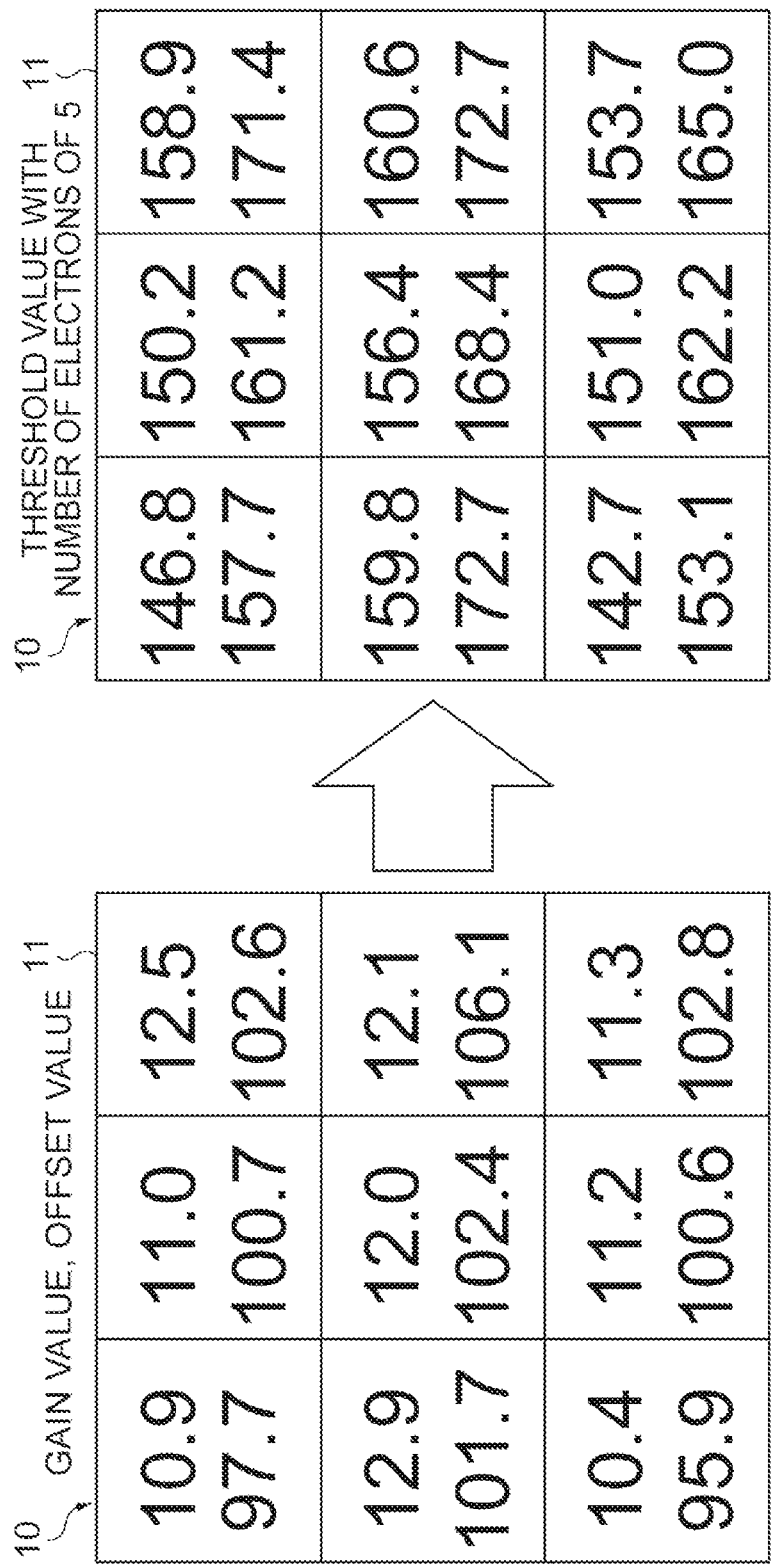
FIG. 12 is a diagram illustrating a correspondence between a gain and an offset value, and a threshold value.
Figure 13:
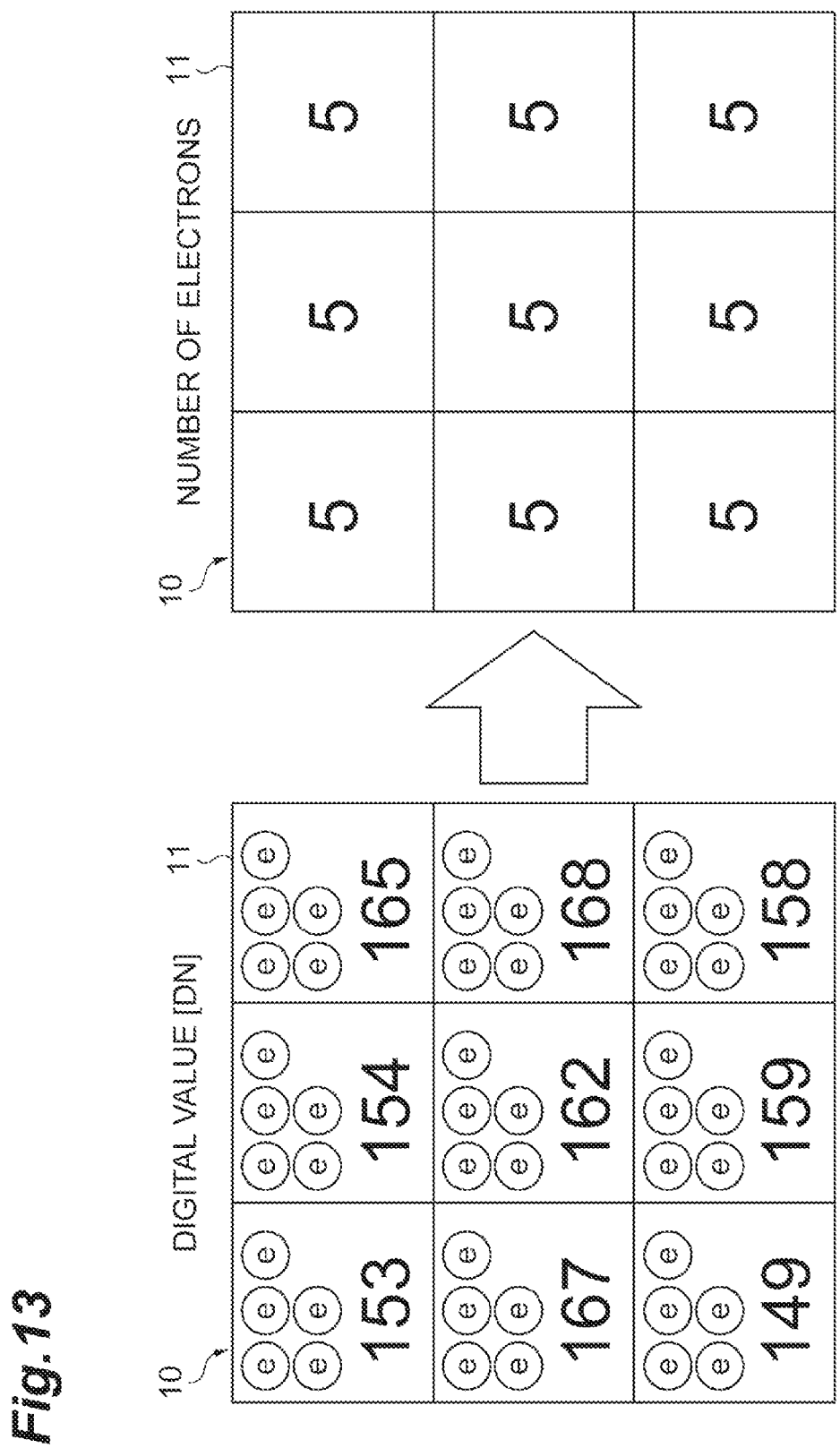
FIG. 13 is a diagram schematically illustrating a process of converting a measured digital value to a number of photons.

Thereby, for example, the threshold value when it is determined that the number of electrons is 5 electrons can be derived as illustrated in FIG. 12. FIG. 12 is a diagram illustrating a correspondence between the gain and the offset value, and the threshold value. In FIG. 12, the acquired gain and offset value is shown for each pixel. Further, a threshold value when it is determined that the number of electrons is 5 is shown for each pixel. For example, when the gain is 10.9 [DN/e]

and the offset value is 97.7 [DN], the lower limit threshold value is 146.8 [DN] and the upper limit threshold value is 157.7 [DN]. The storage unit 21 has, as a table, threshold value data corresponding to each number of electrons for each pixel. FIG. 13 is a diagram schematically illustrating a process of converting a measured digital value of each pixel to the number of electrons. The conversion unit 22 can derive a correct number of electrons from the digital value by referring to the table stored in the storage unit 21. For example, in the example of FIG. 9, when the digital value is 162 [DN], it is determined that the number of electrons is 6, but in the example of FIG. 13, it is determined that the number of electrons is 5. The conversion unit 22 can obtain the average number of photons by dividing the average number of electrons for each pixel by the quantum efficiency.

Figure 14:
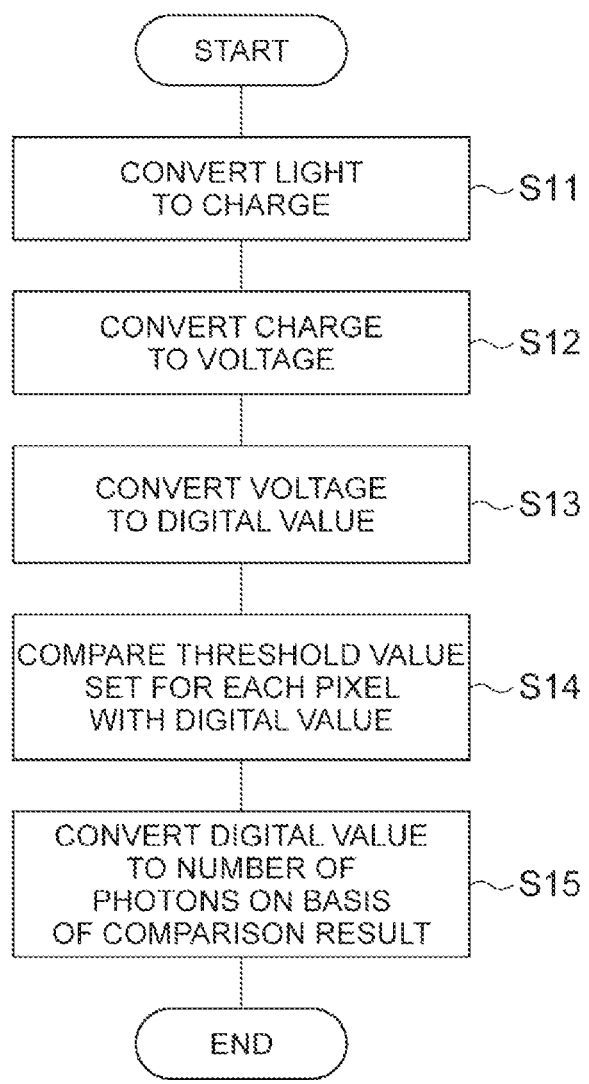
FIG. 14 is a flowchart illustrating an operation of the photon counting device according to an embodiment.

Next, an operation of the photon counting device 1 will be described. FIG. 14 is a flowchart illustrating an operation of the photon counting device. In the first embodiment, when the measurement is started in a state in which the photon counting device 1 is operated, photons incident on the pixels 11 of the CMOS image sensor 10 are first converted to charge by the photodiodes 12 (step S11). The converted charge is converted to a voltage by the amplifier 13 (step S12). The voltage is converted to a digital value by the A/D converter 15 and output to the computer 20 (step S13). The digital value is compared with a threshold value set for each pixel 11 by the conversion unit 22 of the computer 20 (step S14), and is converted to the number of photons on the basis of a comparison result (step S15). Thereby, the number of photons input to each pixel is measured. A measurement result may be displayed on the display device 25 as, for example, image data.

As described above, in the photon counting device 1, the digital value is converted to the number of photons by the conversion unit 22. The conversion unit 22 converts the digital value to the number of electrons using a threshold value set for each pixel by referring to the table stored in the storage unit 21. The table is created in consideration of the respective gains and offset values in the plurality of pixels 11. Therefore, even when there is a variation in the gain and the offset value between the pixels 11, the conversion unit 22 can convert the digital value to the number of electrons while curbing an influence of the variation. Therefore, degradation of photon counting accuracy can be curbed.

The table has a plurality of pieces of threshold value data respectively corresponding to the plurality of pixels 11. In this configuration, since appropriate threshold value data is created for each pixel 11 according to variations in the gain and the offset value, the number of electrons can be accurately determined. Further, for example, it is not necessary to correct the digital values in consideration of variations.

Readout noise of the amplifier 13 may be equal or less than 0.2 [e-rms]. In this case, for example, the incorrect detection rate can be curbed to 1% or less. Further, the readout noise of the amplifier 13 may be equal or less than 0.15 [e-rms]. In this case, for example, the incorrect detection rate can be curbed to 0.1% or less.

The gain may be equal to or more than 10 [DN/e]. Since the CMOS image sensor 10 has a high gain, it is possible to accurately reproduce an analog value output from the amplifier 13 as a digital value.

Second Embodiment

A photon counting device according to a second embodiment is different from the photon counting device of the first embodiment in a configuration of the storage unit 21 and the conversion unit 22. Hereinafter, differences from the first embodiment will be mainly described. Since a configuration of the device is the same as that in the first embodiment illustrated in FIG. 1, a description thereof will be omitted.

The storage unit 21 stores a table (reference data) for converting the digital value output from the CMOS image sensor 10 to the number of electrons. The table is created on the basis of the respective gains and offset values in the plurality of pixels 11. The storage unit 21 in the second embodiment stores a gain and an offset value for each pixel 11 as a table. Further, the storage unit stores the threshold value data for each number of electrons common to all the pixels 11 as a table.

The conversion unit 22 may correct the digital value of each of the plurality of pixels 11 so that an influence of the variation in the gain and offset value among the plurality of pixels 11 is curbed, on the basis of the respective gains and offset values in the plurality of pixels 11, and convert the corrected digital value to the number of photons. In the second embodiment, the conversion unit 22 corrects the digital value of each pixel 11 so that an apparent gain and offset value (parameter) of each pixel 11 become the same. The digital value after the correction can be derived on the basis of a deviation between a gain and an offset value of each pixel and an apparent gain and an apparent offset value common to all the pixels. In this case, the digital value after the correction is derived using the following correction equation. The apparent gain and the apparent offset value may be set in advance and stored in the storage unit 21 or the conversion unit 22.

Figure 15:
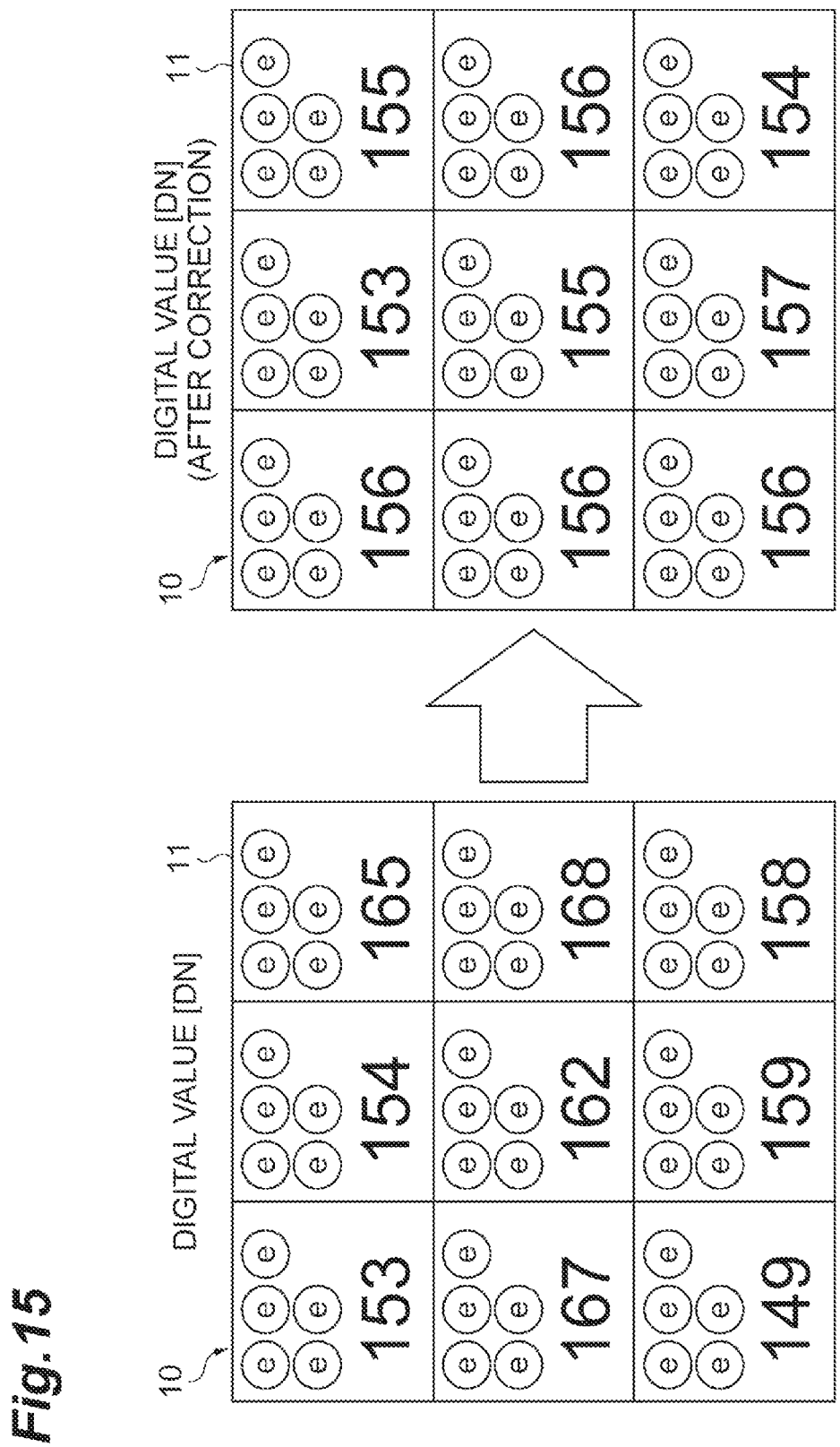
FIG. 15 is a diagram illustrating a correspondence between a measured digital value and a digital value after correction.

Digital value after correction=((digital value−offset value)/gain)×apparent gain+apparent offset value FIG. 15 is a diagram illustrating a correspondence between the measured digital value and a digital value after correction. In an example of FIG. 15, an example in which the digital value measured by the CMOS image sensor (see FIG. 9) 10 in the first embodiment has been corrected by the above correction equation is shown. In this example, the conversion unit 22 corrects the digital value so that the apparent gain in all the pixels is 11 [DN/e] and the apparent offset value is 100 [DN]. That is, the digital value after the correction is derived using the following correction equation.

Digital value after correction=((digital value−offset value)/gain)×11+100

The conversion unit 22 acquires the number of electrons using threshold value data common to the respective pixels with respect to the digital value after the correction. For example, the storage unit 21 may hold a threshold value range derived by the following equation as a table. The conversion unit 22 can convert the digital value after the correction to the number of electrons by referring to the threshold value data held in the table. In the example of FIG. 15, since the apparent gain is 11 [DN/e] and the apparent offset value is 100 [DN], it is determined that the number of electrons is 5 when the digital value after the correction is 150 to 160. The conversion unit 22 can obtain the average number of photons by dividing the average number of electrons for each pixel by the quantum efficiency.

Figure 16:
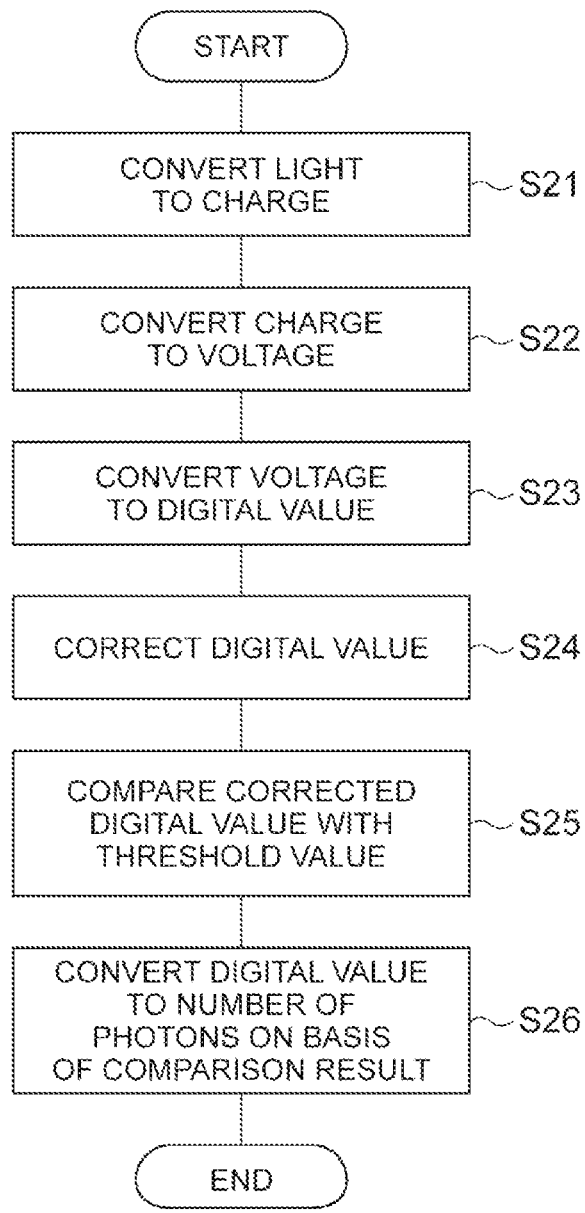
FIG. 16 is a flowchart illustrating an operation of a photon counting device according to another embodiment.

Threshold value (lower limit)=(number of electrons−0.5)×apparent gain+apparent offset value Threshold value (upper limit)=(number of electrons+0.5)×apparent gain+apparent offset value FIG. 16 is a flowchart illustrating an operation of the photon counting device. In the second embodiment, when the measurement is started in a state in which the photon counting device 1 is operated, light incident on the pixels of the CMOS image sensor 10 is first converted to charge by the photodiode 12 (step S21). The converted charge is converted to a voltage by the amplifier 13 (step S22). The voltage is converted to a digital value by the A/D converter 15 and output to the computer 20 (step S23). The digital value is corrected for each pixel by the conversion unit 22 of the computer 20 (step S24). The corrected digital value is compared with the set threshold value data (step S25), and is converted to the number of photons on the basis of a comparison result (step S26). Thereby, the number of photons input to each pixel is measured.

In the second embodiment, the digital value is corrected according to the variation in the gain and the offset value so that an influence of the variation is curbed. Therefore, the digital value after the correction can be converted to the number of electrons using the same threshold value data in all pixels, as described above.

Although the embodiments have been described in detail with reference to the drawings, a specific configuration is not limited to the embodiments.

For example, the conversion unit may obtain the number of electrons for each pixel by dividing the value obtained by subtracting the offset value from the measured digital value by the gain, as in the following equation. In this case, a common threshold value range corresponding to all the pixels may be used for the obtained number of electrons. For example, a common threshold value range may be set with the upper and lower limits of the threshold value range being intermediate values of the number of electrons, as described above. In this case, the threshold value range corresponding to five electrons is equal to or more than 4.5e and less than 5.5e.

Number of electrons=((digital value−offset value)/gain)

Further, in the CMOS image sensor 10 of the embodiment, an example in which the readout noise of each pixel is equal to or less than 0.4 [e-rms] has been described. However, even when the readout noise is 0.4 [e-rms] in a sensor specification, noise of some pixels may be greater than 0.4 [e-rms]. In such a case, pixels of which the readout noise is equal to or less than 0.4 [e-rms] may be ascertained in advance by measurement or the like, and photon counting may be executed using only the pixels of which the readout noise is equal to or less than 0.4 [e-rms].

REFERENCE SIGNS LIST

1: Photon counting device
11: Pixel
12: Photodiode (photoelectric conversion element)
13: Amplifier
15: A/D converter
21: Storage unit
22: Conversion unit

The invention claimed is:

1. A device for photon counting comprising:
a CMOS image sensor including plurality of pixels each including a photoelectric conversion element configured to convert input light to charge, and an amplifier configured to amplify the charge converted by the photoelectric conversion element and convert the charge to a voltage;
an A/D converter configured to convert the voltages output from the amplifiers of the plurality of pixels to digital values; and
a computer configured to convert the digital value output from the A/D converter to a number of photons by referring to reference data, for each of the plurality of pixels,
wherein a readout noise of the amplifier is equal to or less than 0.4 e-rms, and
wherein the reference data is threshold value data for distinguishing between adjacent numbers of photons.

2. The device according to claim 1, wherein the computer is configured to convert the digital value of only the pixels of which the readout noise is equal to or less than 0.4 e-rms.

3. The device according to claim 1, wherein the readout noise of the amplifier is equal to or less than 0.2 e-rms.

4. The device according to claim 1, wherein the readout noise of the amplifier is equal to or less than 0.15 e-rms.

5. The device according to claim 1, wherein the computer is further configured to create a two-dimensional image indicating the number of photons in each pixel based on the number of photons.

6. The device according to claim 1, wherein the computer is further configured to create a histogram that is a plot of the number of pixels with respect to the number of photons.

7. The device according to claim 1, wherein the A/D converter is provided in each pixel.

8. The device according to claim 1, wherein the computer is configured to divide an average number of electrons for each pixel by a quantum efficiency to obtain an average number of photons.

9. The device according to claim 1, wherein the reference data is a look-up table.

10. A method for photon counting the method comprising:
converting light input to respective photoelectric conversion elements of a plurality of pixels of a CMOS image sensor to charge;
amplifying, by an amplifier constituting each of the plurality of pixels, the converted charge and converting the charge to a voltage;
converting, by an A/D converter, the voltage output from the amplifier to a digital value and outputting the digital value; and
converting the digital value of each of the plurality of pixels output from the A/D converter to a number of photons by referring to reference data, for each of the plurality of pixels,
wherein a readout noise of the amplifier is equal to or less than 0.4 e-rms, and
wherein the reference data is threshold value data for distinguishing between adjacent numbers of photons.

11. The method according to claim 10, wherein the converting converts the digital value of only the pixels of which the readout noise is equal to or less than 0.4 e-rms.

12. The method according to claim 10, wherein the readout noise of the amplifier is equal to or less than 0.2 e-rms.

13. The method according to claim 10, wherein the readout noise of the amplifier is equal to or less than 0.15 e-rms.

14. The method according to claim 10, further comprising:
creating a two-dimensional image indicating the number of photons in each pixel based on the number of photons.

15. The method according to claim 10, further comprising:
creating a histogram that is a plot of the number of pixels with respect to the number of photons.

16. The method according to claim 10, wherein the A/D converter is provided in each pixel.

17. The method according to claim 10, further comprising:
dividing an average number of electrons for each pixel by a quantum efficiency to obtain an average number of photons.

18. The method according to claim 10, wherein the reference data is a look-up table.

19. A computer comprising:
a data processor configured to convert a digital value of each of the plurality of pixels output from an A/D converter of a CMOS image sensor to a number of photons by referring to reference data, for each of the plurality of pixels,
wherein the reference data is threshold value data for distinguishing between adjacent numbers of photons.

20. A non-transitory computer-readable storage medium storing a program, the program causing the computer to:
convert a digital value of each of the plurality of pixels output from an A/D converter of a CMOS image sensor to a number of photons by referring to reference data, for each of the plurality of pixels,
wherein the reference data is threshold value data for distinguishing between adjacent numbers of photons.

* * * * *